United States Patent [19]

Schuster et al.

[11] Patent Number: 5,081,336
[45] Date of Patent: Jan. 14, 1992

[54] METHOD FOR SOLDERING COMPONENTS ONTO PRINTED CIRCUIT BOARDS

[75] Inventors: Rudolf Schuster, Heimstetten; Josef Raschke, Gelting; Hermann Bloessl, Munich, all of Fed. Rep. of Germany

[73] Assignee: Siemens Aktiengesellschaft, Munich, Fed. Rep. of Germany

[21] Appl. No.: 588,033

[22] Filed: Sep. 25, 1990

[30] Foreign Application Priority Data

Sep. 29, 1989 [DE] Fed. Rep. of Germany ....... 3932702

[51] Int. Cl.[5] .......................... B23K 1/00; B23K 3/047
[52] U.S. Cl. ................................................ 219/85.16
[58] Field of Search ............... 219/85.16, 85.19, 85.22, 219/233, 85.18; 228/180.1, 180.2, 44.7, 51, 55, 20 R, 20 HT, 179

[56] References Cited

U.S. PATENT DOCUMENTS

| | | | |
|---|---|---|---|
| 4,135,630 | 1/1979 | Snyder et al. | |
| 4,255,644 | 3/1981 | Delorme | 219/233 |
| 4,552,300 | 11/1985 | Zovko et al. | 219/85.1 |
| 4,605,833 | 8/1986 | Lindberg | 228/179 |
| 4,805,830 | 2/1989 | Kawaguchi | 228/179 |
| 4,910,383 | 3/1990 | Zimmer | 219/85.16 |
| 4,942,282 | 7/1990 | Jensen | 219/85.16 |
| 4,982,890 | 1/1991 | Schuster et al. | 219/85.16 |

FOREIGN PATENT DOCUMENTS

| | | |
|---|---|---|
| 2818958A1 | 11/1978 | Fed. Rep. of Germany . |
| 0011046 | 11/1979 | Fed. Rep. of Germany . |
| 3149236A1 | 8/1982 | Fed. Rep. of Germany . |

OTHER PUBLICATIONS

"Soldering Machines take on Quad Flat Packs", p. 14 of Electroniz Packaging and Production; Feb. 1988.

Primary Examiner—Geoffrey S. Evans
Attorney, Agent, or Firm—Hill, Van Santen, Steadman & Simpson

[57] ABSTRACT

A method wherein the component to be soldered is placed onto the printed circuit board, whereupon the stirrup electrodes of the soldering mechanism are lowered and the terminal legs of the component are pressed against the printed circuit board with a force. After heating the stirrup electrodes for melting the solder, a further advance of the stirrup electrodes ensues for impressing the terminal legs into the molten solder. The formation of a solder layer between terminal legs and printed circuit board subsequently ensues by reducing the force exerted onto the stirrup electrodes and/or by defined retraction of the stirrup electrodes.

13 Claims, 2 Drawing Sheets

METHOD FOR SOLDERING COMPONENTS ONTO PRINTED CIRCUIT BOARDS

BACKGROUND OF THE INVENTION

The invention relates to a method for soldering components onto printed circuit boards using a soldering mechanism having at least one stirrup electrode heatable by electrical resistance heating.

Soldering mechanisms having stirrup electrodes secured to a soldering stirrup holder and heatable by electrical resistance heating are disclosed, for example, by DE-A-31 49 236, by DE-A-28 18 958 and corresponding U.S. Pat. No. 4,255,644, or by EP-A-0 011 046. Such soldering mechanisms having two stirrup electrodes lying in parallel opposite one another or having four stirrup electrodes lying opposite one another in pairs are particularly utilized for soldering multi-pole electronic components such as micropacks, flat packs and the like.

DE-A-31 49 236 discloses a tool consisting of at least two vertical and parallel bars made of a conducting material and electrically insulated from each other. The bottom ends of the bars are screwed for holding at least two thermodes. Each thermode is made of a material with low electrical resistance and low thermal inertia, so it is rapidly heated by the passage of an electric current through the thermode. The preferred tool uses four vertical bars located at the corners of a square and carrying four thermodes. Each thermode consists of a U-shaped strip with a narrow web and widened legs with holes for screws so the thermodes can be attached to the bars. The tool has four small Au-plated brass columns forming a rectangular or square section at the lower ends of which are thermodes, connected between adjacent columns and cut from a single plate, in the form of a U with widened ends for good electrical contact with the columns. The cut faces of the plates contact the elements to be welded. Columns diagonally opposed are connected to one pole of the power source. The tool has a simple design but thermodes are resistant to flexure. Also, minimum contact surface with welded parts, accurate control of temperature distribution, and partly replaceable construction are further advantages.

EP-A-0 011 146 discloses an apparatus where in the working surface of a bit, electric current flows along at least two separate paths which are joined together at both ends. The current in the two paths is preferably switched in parallel; and the paths may form a ring surface on the working end of the bit. The current may be fed into two zones separated from each other by 180 degrees on a ring bit, and then flows out of the ring via two more zones which are also separated from each other by 180 degrees and are 90 degrees from the current inlet zones. The apparatus is useful for the soldering of flat contact tags on an electronic component to a carrier or board.

When such soldering mechanisms are additionally equipped with a suction pipette arranged centrally between the stirrup electrodes, the mechanism can be utilized for the automatic equipping of the printed circuit boards with the components to be soldered thereon. When equipping according to what is referred to as the "pick and place" principle, the combined equipping and soldering head moves over the delivery modules of the components and over the printed circuit board arranged in the equipping region, whereby the suction pipette picks up the respective component from a delivery module and places the component on the printed circuit board in the prescribed equipping position.

After the respective component has been placed down, the soldering stirrup holder is then lowered, so that an optimally reliable contact derives between the working surfaces of the stirrup electrodes, the terminal legs of the component, and the interconnects, or, respectively, terminal pads of the printed circuit board both before the soldering process as well as over the entire duration of the soldering process. The suction pipette can remain on the component until the soldering process is ended; it can press the component against the soldering location on the printed circuit board with a limited force.

In the soldering process triggered by the electrical resistance heating of the stirrup electrodes, the solder provided for the soldering, arranged on or integral with the terminal pads, melts. This melting leads to what is referred to as a sagging or re-sagging of the stirrup electrodes. The size of the corresponding sag stroke of the stirrup electrodes is thereby mainly dependent on the force exerted by the soldering stirrup holder, whereby other factors such as, for example, bent or differently shaped terminal legs of the components or such as a skewed position of the components on the printed circuit board can also have a not inconsiderable influence. These conditions for the sagging or re-sagging of the stirrup electrodes that differ from component to component then necessarily lead to solder points that are differently fashioned, whereby the desired reliability and quality of the soldering is often not achieved.

SUMMARY OF THE INVENTION

The object of the invention is to create a method for soldering components onto printed circuit boards, wherein the terminal legs of the component and the allocated interconnects or terminal pads of the printed circuit boards are joined to one another by at least largely reproducible solderings of uniformly high quality.

This object is inventively achieved by the following steps:

a) placing the component onto the prescribed equipping position of the printed circuit board;

b) lowering at least one stirrup electrode onto the terminal legs of the component;

c) exertion of a force onto the stirrup electrode for pressing the terminal legs against the allocated interconnects or terminal pads of the printed circuit board;

d) heating the stirrup electrode until the solder provided for the soldering melts;

e) further advance of the stirrup electrode for impressing the terminal legs into the melted solder;

f) formation of a solder layer between the terminal legs and interconnects or the terminal pads by reducing the force exerted onto the stirrup electrode and/or by defined retraction of the stirrup electrode.

The invention is based on the perception that differently constituted solder locations arise in the impression of the terminal legs into the molten solder due, for example, to a premature seating of one or more terminal legs and that these differences can be compensated by reducing the force exerted on the stirrup electrode and/or by a defined retraction of the stirrup electrode. These two measures undertaken individually or together then effect the formation of defined solder layers between the terminal legs and the allocated interconnects or terminal pads.

In a preferred development of the method of the invention, the component in step a) is put in place with a suction pipette and the component is pressed against the printed circuit board by exerting a limited force on the suction pipette. After a defined retraction of the stirrup electrode, the component with the suction pipette can then be pulled back relative to the stirrup electrode in this case, so that solder layers of uniform thickness are guaranteed at all solder locations of the soldering process.

In another, particularly preferred development of the method of the invention, the further advance according to step e) is monitored and is limited to a prescribed value. The quality of the individual solder locations can be further improved with such a monitoring and limiting of the sagging stroke and, moreover, an undesired lateral emergence of the molten solder between terminal legs and interconnects or terminal pads can be prevented.

An exemplary embodiment of the invention is shown in the drawing and shall be set forth in greater detail below.

DETAILED DESCRIPTION OF THE PREFERRED EMBODIMENTS

Figure 1:
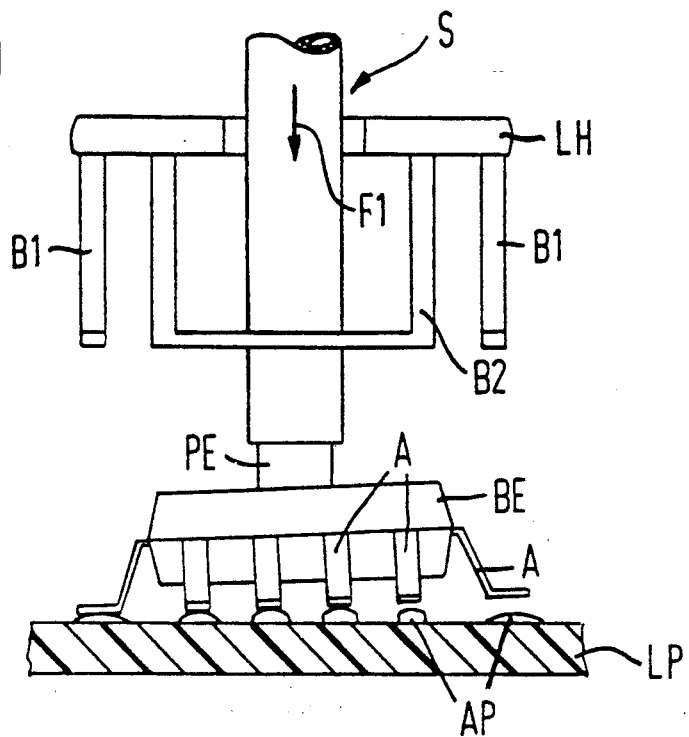
FIG. 1 is an elevational schematic view of a soldering mechanism having a component positioned on a printed circuit board to be subsequently soldered.

FIG. 1 shows a highly simplified, schematic illustration of the fundamental principle of a soldering mechanism utilized in the method of the invention, whereby those parts such as power leads and the like that are not necessary for an understanding of the invention have been omitted. The illustrated soldering mechanism has four U-shaped stirrup electrodes secured to a soldering stirrup holder LH, whereby respectively two U-shaped stirrup electrodes B1 and two U-shaped stirrup electrodes B2 are aligned in parallel pairs in a spaced apart arrangement, working surfaces at an under side of the stirrup electrodes B1 and B2 form a non-closed rectangular or quadratic frame in the end regions. The dimensions of this frame are thereby matched to the shape and position of the doubly bent off terminal legs A of a component BE to be soldered onto terminal pads AP of a printed circuit board LP. The components BE to be soldered thereon are taken from a magazine or from a delivery module (not shown) with the suction pipette S of an equipping head (not shown in detail in the drawing) and are placed onto the prescribed soldering location on the printed circuit board LP. The structure and functioning of an equipping head equipped with a suction pipette is taught, for example, in U.S. Pat. No. 4,135,630.

When placing the component BE into the prescribed equipping position of the printed circuit board LP, the doubly bent off terminal legs A should come into contact with the terminal pads AP. Due, however, to an angular offset of the printed circuit board LP, or an arcing of the printed circuit board LP, or different heights of the terminal pads AP, or differently bent terminal legs A or similar causes, a skewed attitude of the component BE that is shown exaggerated in FIG. 1 can occur relative to the printed circuit board LP. In view of such a skewed attitude of the component BE, the lower end of the suction pipette S carries a pipette insert PE that is composed of an elastically deformable material and, thus, can adapt to the attitude of the component BE. As a result of this elastic adaptation of the pipette insert PE that, for example, is composed of hard rubber or of silicone rubber, the suction pipette S can then be unproblematically used to press the exactly positioned components BE against the printed circuit board LP before the soldering process up to a time shortly before the end of the soldering process, pressing it thereagainst with a limited force F1 of, for example, 0.1N through 0.5N that is also shown in FIG. 3.

Figure 2:
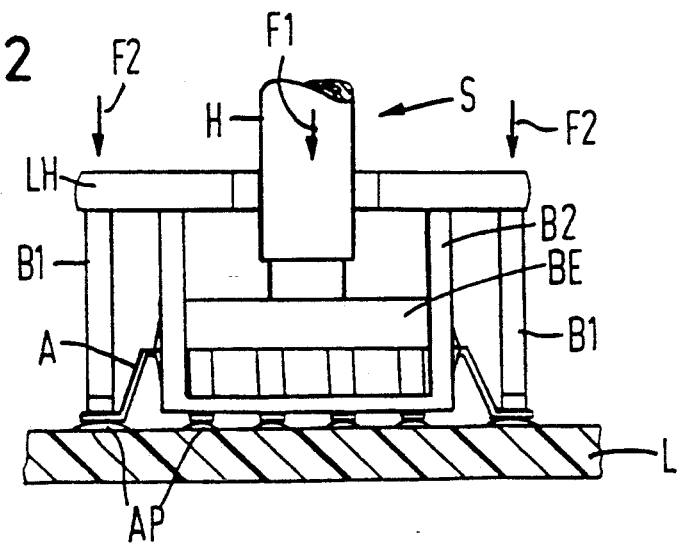
FIG. 2 is an elevational schematic view of the soldering mechanism of FIG. 1 after the component has been soldered.

After the positioning and pressing of the component BE, the soldering stirrup holder LH is moved down according to FIG. 2, i.e. the stirrup electrode B1 and B2 are lowered onto the terminal legs A of the component BE. By exerting a force F2 of, for example, 40N that is also shown in FIG. 3, the terminal legs A are then pressed by the stirrup electrodes B1 or, respectively, B2 against the allocated terminal pads AP of the printed circuit board LP.

As soon as the full pressing force F2 is reached, the electrical resistance heating of the stirrup electrodes B1 and B2 starts for melting the solder of the terminal pads AP provided for the soldering. The chronological curve of the temperature T of the stirrup electrodes B1 and B2 over the entire duration of the soldering process is likewise shown in FIG. 3.

Figure 3:
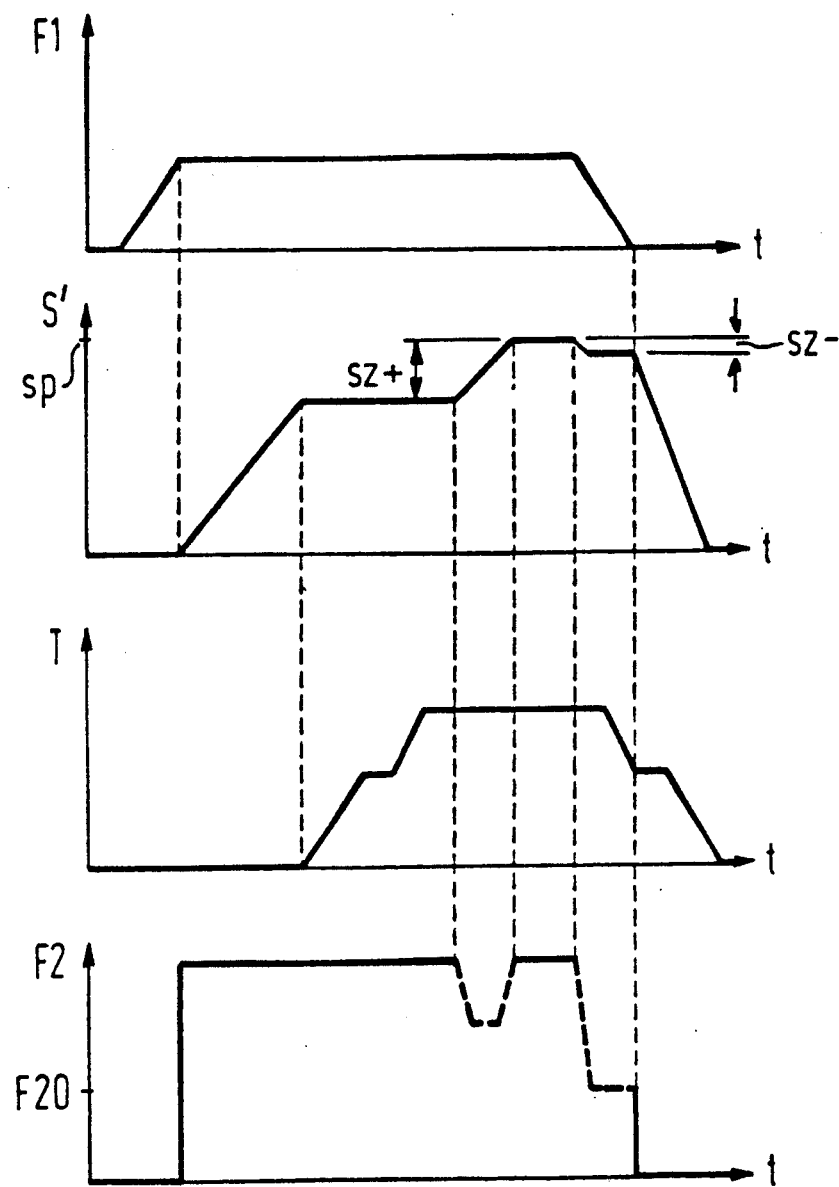
FIG. 3 is a graphical representation of the dependency of critical process parameters of a soldering process on soldering time in an arrangement as disclosed in FIGS. 1 and 2.

The path or, respectively, the advance S' dependent on the time t for the overall duration of a soldering process may also be seen from FIG. 3. It may thereby be seen that the terminal legs A are pressed farther into the molten solder after the lowering of the stirrup electrodes B1 and B2 and the melting of the solder that begins shortly after the maximum temperature is reached. This impressing is shown by the further advance sz+ of the stirrup electrodes B1 and B2. The further advance sz+, that can also be referred to as sagging stroke, is monitored by a path measuring system (not shown in the drawing) and is limited to a prescribed, programmable value sp. For example, the further advance amounts to 20 through 30 micrometers.

After the sagging stroke identified by the further advance sz+ has been reached, the force F2 exerted onto the stirrup electrodes B1 and B2 is reduced to a programmed force F20 of, for example, 10 through 15N. A defined retraction sz— of the stirrup electrodes B1 and B2 by an amount of, for example, 10 micrometers then follows. After the defined retraction sz—, the component BE is also pulled back against the stirrup electrodes B1 and B2 with the suction pipette S. This latter measure, however, can be eliminated when the terminal legs A press against the retracted stirrup electrodes B1 and B2 as a result of elasticity of the terminal legs A.

The above-described reduction of the force F2 exerted onto the stirrup electrodes B1 and B2 and the defined retraction sz— of the stirrup electrodes B1 and B2 effect the formation of a defined solder layer between the terminal legs A and the printed circuit board LP. This defined solder layer is shown in FIG. 2 by the shape of the terminal pad AP that has melted and has resolidified after the end of the soldering process. The formation of a defined solder layer in many instances can also be effected only on the basis of an appropriate reduction of the force F2 or only on the basis of a defined retraction sz— of the stirrup electrodes B1 and B2 as well.

Although the present invention has been described with reference to a specific embodiment, those of skill in the art will recognize that changes may be made thereto without departing from the scope and spirit of the invention as set forth in the appended claims.

We claim as our invention:

1. A method using at least one stirrup electrode for soldering components having terminal legs onto printed circuit boards having terminal pads with solder provided therewith, comprising the following steps:
   a) place the component into the selected equipping position on the printed circuit board;
   b) abut at least one stirrup electrode onto the terminal legs of the component;
   c) exert a force onto the stirrup electrode for pressing the terminal legs against the terminal pads of the printed circuit board;
   d) heat the stirrup electrode for melting the solder provided for the soldering, making molten solder;
   e) further advance the stirrup electrode for impressing the terminal legs into the molten solder;
   f) form a solder layer between terminal legs and terminal pads by reducing the force exerted on the stirrup electrode.

2. Method according to claim 1 wherein the component is put into the equipping position with a suction pipette; and the component is pressed against the printed circuit board by exerting a second force on the suction pipette.

3. Method according to claim 1, wherein the reduction of force exerted on the stirrup electrode to form said solder layer, is accompanied by a defined retraction of the stirrup electrode away from said printed circuit board.

4. Method according to claim 3, wherein following the defined retraction of the stirrup electrode, the component is pulled back against the stirrup electrode by a suction pipette.

5. Method according to claim 1 wherein the further advance of the stirrup electrode for impressing the terminal legs is monitored and is limited to a selected value.

6. A method for soldering components onto printed circuit boards, comprising the following steps:
   a) provide a printed circuit board having arranged thereon allocated interconnects having solder provided thereon;
   b) provide an electronic component having arranged thereon at least one terminal leg for attaching to said allocated interconnect of said printed circuit board;
   c) place said component onto said printed circuit board in a position wherein said terminal leg abuts said allocated interconnect;
   d) provide at least one electrode, arranged movable toward said printed circuit board;
   e) move said electrode abutting said terminal leg of said component;
   f) exert a force onto said electrode to press said terminal leg against said allocated interconnect of said printed circuit board;
   g) heat said electrode for melting solder provided for the connection;
   h) further advance said stirrup electrode to impress said terminal leg into a now molten solder;
   i) form a solder layer between said terminal leg and said allocated interconnect by causing said electrode to retract away from said printed circuit board, a defined distance.

7. A method according to claim 6, wherein in step i) said electrode is caused to retract away from said printed circuit board by selectively reducing said force acting on said electrode toward said printed circuit board.

8. A method according to claim 6, wherein retraction of said electrode in step i), away from said printed circuit board, is accomplished by a selected defined retraction of said electrode.

9. A method according to claim 8, further comprising the step wherein in step i) a lifting means is used to exert a second force on said component to retract said component away from said printed circuit board, to form said solder layer.

10. A method according to claim 9, wherein said lifting means is also used in step c) to place said component onto said printed circuit board.

11. A method according to claim 10, wherein said lifting means comprises a suction pipette.

12. A method according to claim 11, wherein said electrode comprises a stirrup type electrode.

13. A method according to claim 12, wherein said at least one electrode comprises four stirrup type electrodes, each of said four stirrup electrodes pressing at least one terminal leg upon at least one allocated interconnect.

* * * * *